(12) United States Patent
Dietiker

(10) Patent No.: US 6,677,707 B1
(45) Date of Patent: Jan. 13, 2004

(54) SIDE-EMITTING SURFACE MOUNTED LIGHT EMITTING DIODE

(75) Inventor: Thomas Dietiker, R.P.V., CA (US)

(73) Assignee: The Regents of the University of California, Oakland, CA (US)

( * ) Notice: Subject to any disclaimer, the term of this patent is extended or adjusted under 35 U.S.C. 154(b) by 366 days.

(21) Appl. No.: 09/612,163

(22) Filed: Jul. 8, 2000

Related U.S. Application Data
(60) Provisional application No. 60/166,591, filed on Nov. 19, 1999.

(51) Int. Cl.[7] ............................ H01L 33/00; H01L 35/10
(52) U.S. Cl. ........................... 313/498; 362/800; 257/99
(58) Field of Search ................... 313/498, 512, 313/499, 503; 257/79, 99; 445/22; 362/545, 296, 255, 257, 249, 800

(56) References Cited

U.S. PATENT DOCUMENTS

| | | | |
|---|---|---|---|
| 4,781,960 A | | 11/1988 | Wittes |
| 4,897,602 A | * | 1/1990 | Lin et al. .................. 324/754 |
| 4,897,769 A | | 1/1990 | Lang |
| 5,122,943 A | * | 6/1992 | Pugh .......................... 362/256 |
| 5,331,512 A | | 7/1994 | Orton |
| 5,764,486 A | | 6/1998 | Pendse |
| 5,807,122 A | | 9/1998 | Heeb et al. |
| 5,857,767 A | * | 1/1999 | Hochstein ................... 362/294 |
| 5,865,529 A | * | 2/1999 | Yan ............................. 362/327 |
| 5,977,566 A | * | 11/1999 | Okazaki et al. .............. 257/99 |
| 6,136,627 A | * | 10/2000 | Ogihara et al. ............... 438/45 |
| 6,371,637 B1 | * | 4/2002 | Atchinson et al. .......... 362/555 |

OTHER PUBLICATIONS

"Right Angle Surface Mount Flip Chip and Chip LEDs" Part HSMx–C660 Catalog 5968–3198E (12/98) Web address at Hewlett Packard is: www.hp.com/go/led.

"Surface Mounting SMT LED Indicator Components" Application Note 1060. Agilent Technologies (10/00).

* cited by examiner

Primary Examiner—Nimeshkumar D. Patel
Assistant Examiner—Karabi Guharay
(74) Attorney, Agent, or Firm—Greenberg Traurig, LLP; Mark Krietzman

(57) ABSTRACT

A unique side mounted LED and side sensing phototransistor with free-end contacts, useful for thin profile side and back lighting and low-profile touch screen photocircuits, and a method of manufacturing the side mounted side emitting or sensing photo circuit components.

26 Claims, 4 Drawing Sheets

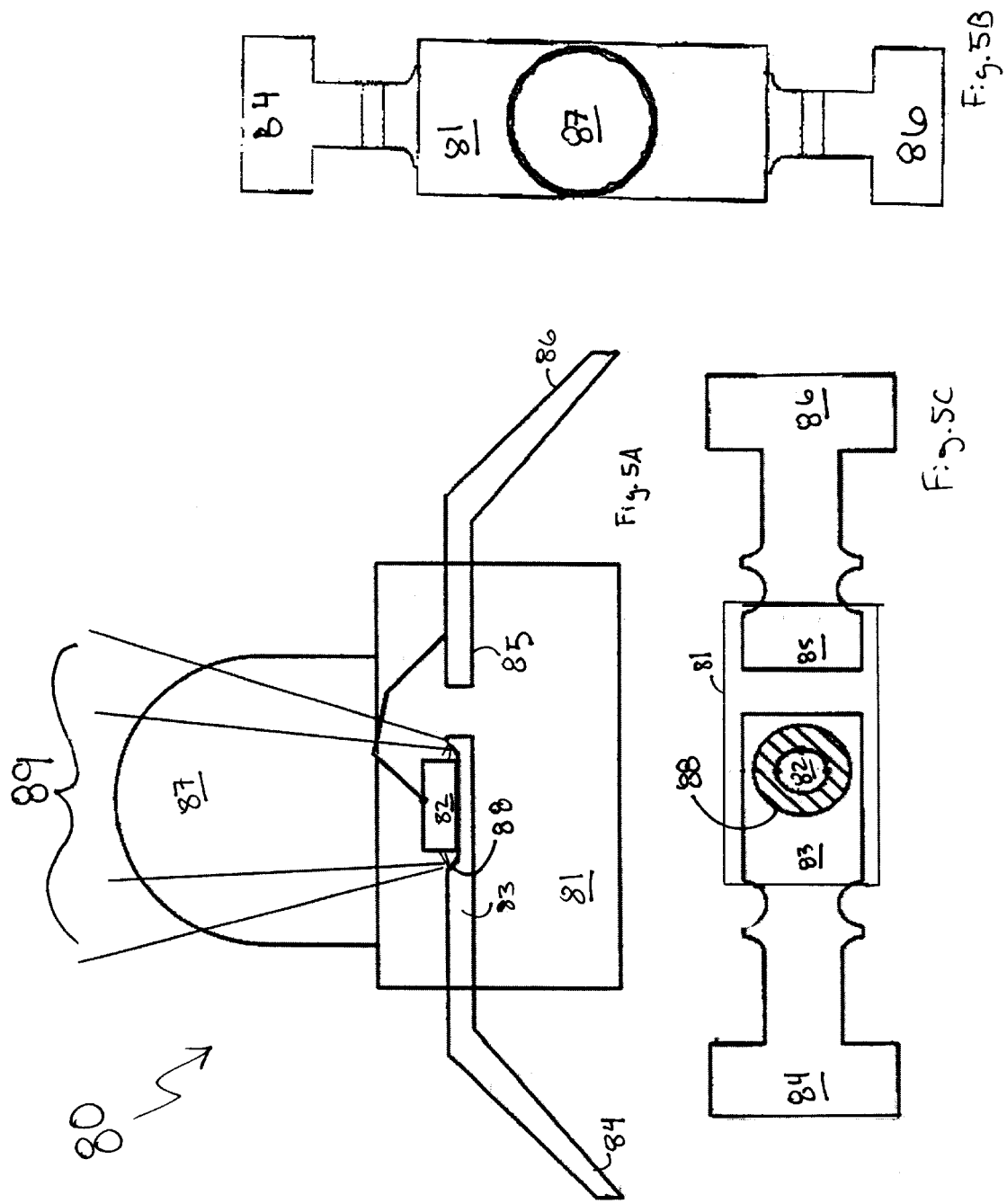

SIDE-EMITTING SURFACE MOUNTED LIGHT EMITTING DIODE

CROSS-REFERENCE TO RELATED APPLICATIONS

The within invention claims the benefit, under Title 35, United States Code 119(e), of Provisional Application No. 60/166,591, filed Nov. 19, 1999 entitled "Side-Emitting Surface Mounted Light Emitting Diode" which is hereby incorporated by this reference.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Field of the Invention

This present invention relates to a novel side mounted light emitting diode LED and more particularly to a novel side mounted LED for thin profile side and back lighting with a pre-selected molded collimating optical element and which may also be formed as a low-profile, surface mounted side sensing photo-transistor. The invention also relates to a novel method of manufacture of the devices.

2. Description of Related Art

To miniaturize lighting and photo circuits operating parallel to the board, low profile LEDs which can produce a controlled side-emission (at a wavelength between 360–2200 nm) and low profile side sensing photo-transistors are useful. Those familiar with board parallel lighting and photo circuits will recognize that the standard procedure for assembly of such components is a through-hole mounted device which normally requires manual bending of the lead wires to achieve alignment.

One prior art method for reducing the cost of manual alignment and allowing for robotic assembly of a snap-in through-hole sideways mounted LED is taught in U.S. Pat. No. 4,897,769, issued to Lang in which an LED, fitted with a snap-in carriage may be robotically assembled.

The art of circuit mounting and light-emitting diodes is plentiful with prior art reductions to practice. One attempt to minimize LED height is taught by Orton in U.S. Pat. No. 5,331,512, wherein an LED is surface mounted on the reverse side of the board and the light is emitted through a hole in the board. The problem of parallel board surface mounting was addressed in U.S. Pat. No. 4,781,960, issued to Wittes, wherein the LED is affixed to a separate housing to accomplish board alignment and surface mounting. Many other prior art devices have surface mount features. The prior art is however void of a side light-emitting diode, or emitter/receptor photo-transistor, suited for surface mounted pick and place assembly with free-end contacts.

BRIEF SUMMARY OF THE INVENTION

An LED with free-end contacts, which protrude from the substrate body of the LED eliminates the circuit failure resulting from contact and substrate separation found in LED and photo-transistor devices with substrate bonded contacts and which often de-bond due to the expansion rate differentiation between contact and substrate or mechanical shock.

While some prior art LEDs may allow for pick and place assembly and surface mounting, the unique flat top and flat bottom of the LED of the current invention, eliminates the need for up or down orientation during assembly and makes the LED self-aligning thereby reducing the defect rate.

Other novel features or improvements include a parallel optically shaped output, relative to the board, making the present invention ideal for use as in for low-profile optical circuits, miniature illumination, and as an IR emitter/collector in touch screen displays.

Accordingly, it is an object of the invention to provide a novel or improved low profile light emitting diode, or collector/emitter which may be surface mounted and which produces a controlled side-emission from 360–2200 nm.

It is yet another object of the invention to provide a novel or improved low profile light emitting diode, or collector/emitter which may be surface mounted with pick and place assembly.

It is yet another object of the invention to provide a novel or improved low profile light emitting diode, or collector/emitter which may be produced with fan angles in a pre-selected planar path from 5 degrees to 90 degrees measured parallel to the board.

It is yet another object of the invention to provide a novel or improved low profile light emitting diode, or collector/emitter with an integral optical lens.

It is yet another object of the invention to provide a novel or improved low profile light emitting diode, or collector/emitter with free-end contacts.

It is yet another object of the invention to provide a novel or improved low profile light emitting diode, or collector/emitter which is self-aligning.

It is yet another object of the invention to provide a novel or improved method of manufacture for a low profile light emitting diode, or collector/emitter with a flat top and bottom mounting surface unmarred, by gate marks, shut-offs or flashings.

The advantages of the invention believed are set forth with particularity in the appended claim. The invention itself, however, both as to configuration, and method of operation, and the advantages thereof, may be best understood by reference to the following descriptions taken in conjunction with the accompanying drawings.

BRIEF DESCRIPTION OF THE DRAWINGS

FIG. 5A is a cut away top view of a second alternate embodiment of the side emitting surface mounted light-emitting diode.

FIG. 5B is a front view of the embodiment in FIG. 5A.

FIG. 5C is a front view of the lead frame component of the embodiment in FIG. 5A.

DETAILED DESCRIPTION OF SEVERAL EMBODIMENTS OF THE INVENTION

Figure 1:
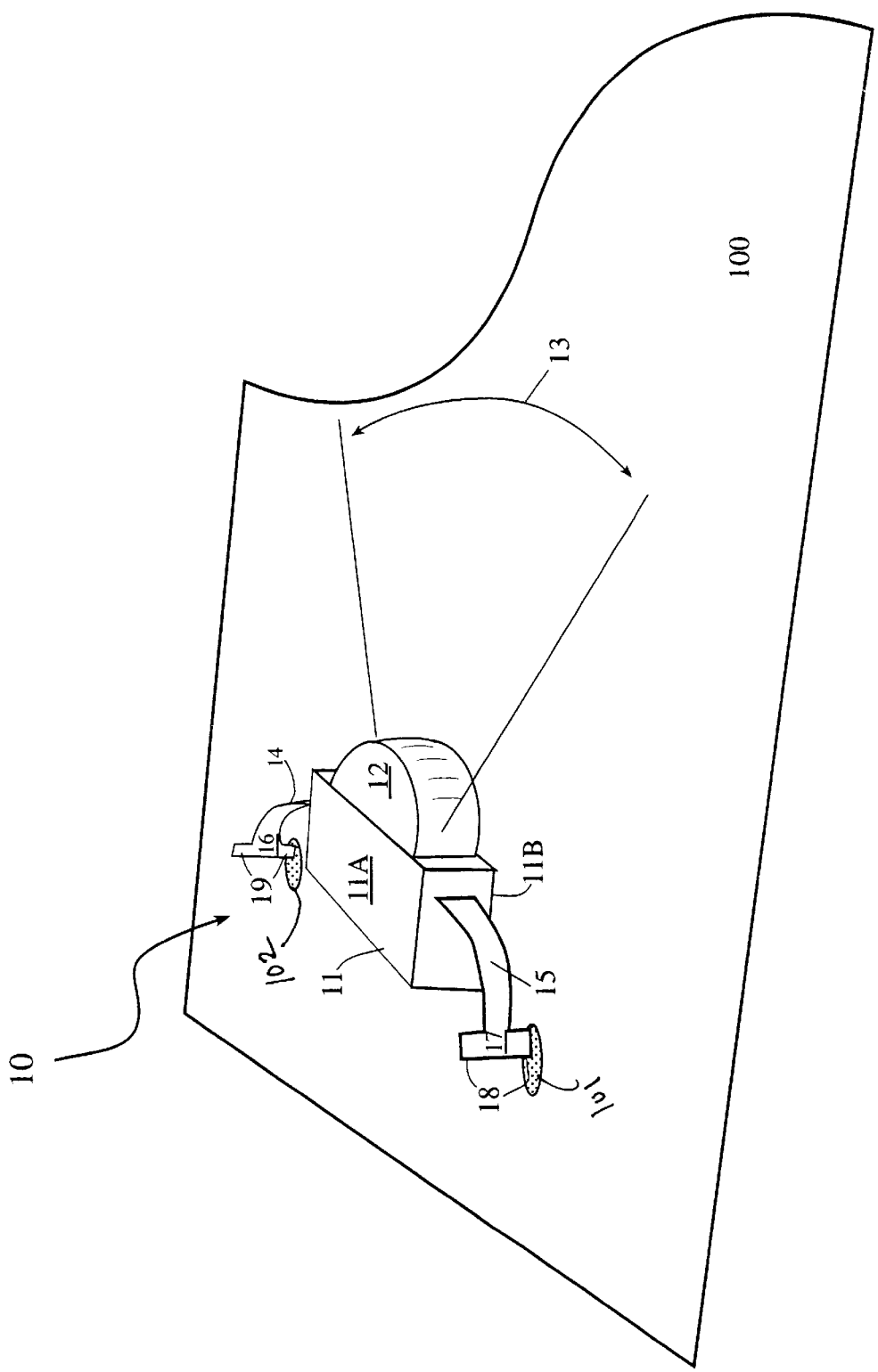
FIG. 1 is an isometric drawing of the preferred LED assembly of the present invention.

Referring now to the drawings, there is illustrated in FIG. 1 an isometric drawing of the side emitting surface mounted light-emitting diode generally designated 10.

The side emitting surface mounted light-emitting diode 10 comprises an encapsulated semi-conductor chip conductively affixed to a metallic substrate. Semi-conductor chips are common in the industry and no specific semi-conductor chip is called out for. A semi-conductor chip which produces an output in the 360–2200 nm range is contemplated. The semiconductor chip may be constructed of Ga—Al—As, Ga—Al—S, Si—C, Ga—P, Ga—As—P, or InGaS.

The semi-conductor chip is encapsulated in an epoxy or ceramic substrate 11 of a suitable optical material, for example a commercial material sold as HYSOL MG-97-8000, or the equivalent. The top 11A and the bottom 11B of the substrate 11 are formed flat through a novel production process further described herein. The flat top 11A and the bottom 11B yields the side emitting surface mounted light-emitting diode 10 which is self-aligning when placed on a circuit board 100 and conductively surface mounted 101 & 102 thereto. It also makes the side emitting surface mounted light-emitting diode 10 reversible, so that it may be mounted top or bottom side down, thereby making the side emitting surface mounted light-emitting diode 10 particularly well-suited for automated pick and place assembly.

The side emitting surface mounted light-emitting diode 10 may also be selectively molded with an optical element 12 formed as part of, or attached to, the substrate 11. The optical element 12 is of a size and shape to cause the illumination to exit the optical element 12 at a pre-determined fan angle 13 relative to the board 100. The side emitting surface mounted light-emitting diode has a first lead 14 which is the anode and a second lead 15 which is the cathode both constructed of a suitable material, for example a commercial material sold as ALLOY-42, or the equivalent. The first 14 and second leads 15 are respectively connected to free-end conductive leads 16 & 17 which extend from the sides of the substrate 11 and are specifically not affixed to the substrate, but rather extend therefrom. "T" shaped mounting guides 18 & 19 are formed at each of the free-end conductive leads 16 & 17 to allow for correct surface mount 101 & 102 and alignment of the side emitting surface mounted light-emitting diode 10 on a circuit board 100.

Figure 2A:
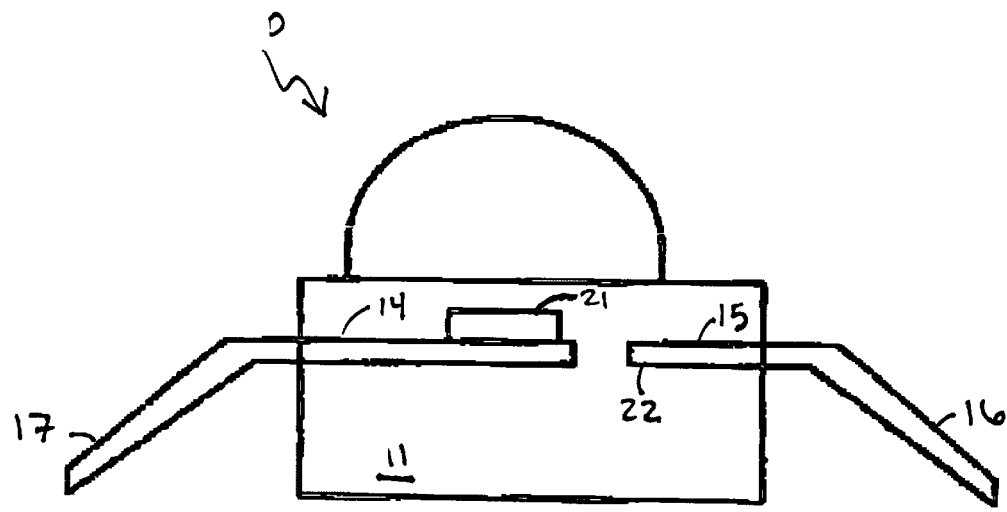
FIG. 2A is a cut-away top view the preferred photo-transistor of the present invention.

Referring now to FIG. 2A, there is illustrated a cut-away top view of the preferred embodiment of the side sensing surface mounted photo-transistor generally designated 20. A light sensing semi-conductor 21 is conductively attached to the first lead 14 and a light collecting portion 22 is conductively attached to the second lead 15. The free-end conductive leads 16 & 17 for the first lead 14 and second lead 15 are remote from the substrate 11, this remote position of the free-end conductive leads 16 & 17 eliminates the disassociation of the metallic leads from the epoxy or ceramic substrate caused by the different expansion rates of the substrate and metallic leads common to LEDs and photo transistors with substrate supported metallic leads. The free-end conductive leads 16 & 17 may expand at a rate different than the substrate 11 without separating from the substrate. 11.

Figure 2B:
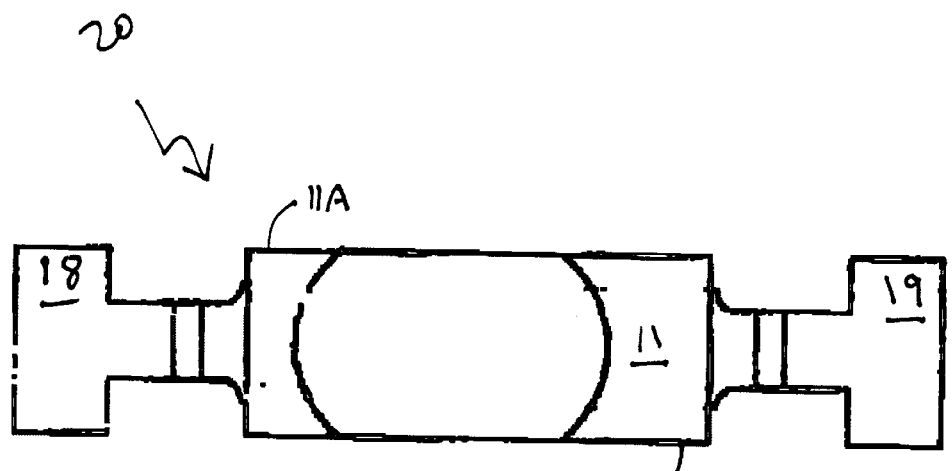
FIG. 2B is a front view of the photo-transistor of FIG. 2A.

Referring now to FIG. 2B, there is illustrated a front view of the side sensing surface mounted photo-transistor generally designated 20. The "T" shaped mounting guides 18 & 19 are of a size and shape to allow for surface mounting either top side 11A up or bottom, side 11B up. It is the flat top and bottom sides 11A & 11B which make the side sensing surface mounted photo-transistor self-aligning with the board. A smooth top and bottom 11A & 11B are for self-aligning of the device and are the result of the unique tool described in FIG. 4.

Figure 3:
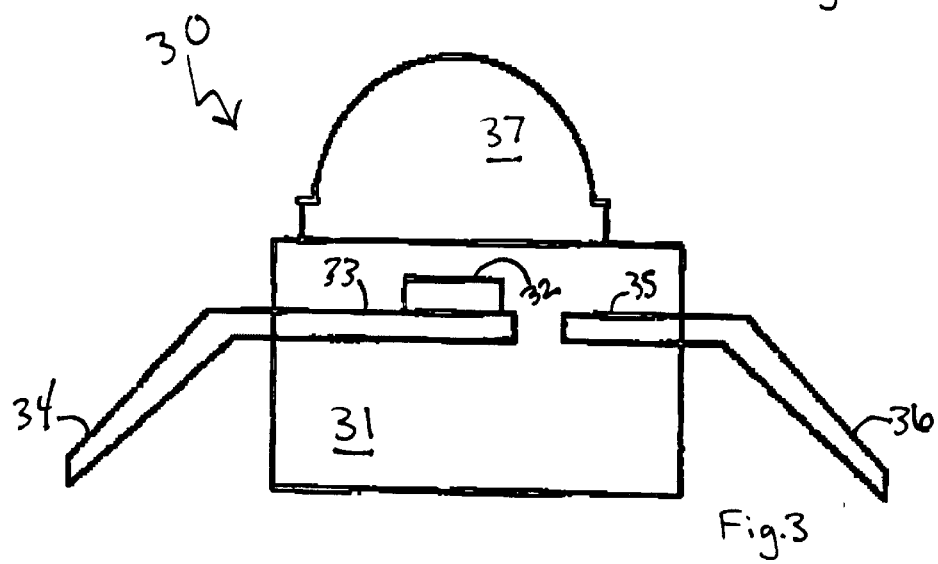
FIG. 3 is a top view of a first alternate embodiment of the side emitting surface mounted light-emitting diode.

Referring now to FIG. 3, there is illustrated an isometric drawing of an alternate embodiment of the side sensing surface mounted light-emitting diode generally designated 30.

Within the epoxy or ceramic encapsulation material 31, a semi-conductor 32 is conductively affixed to a metallic anode lead 33 with an extended first free end 34. The metallic cathode lead 35 is opposite the anode lead 33 with an extended second free end 36. The extended free ends 34 & 36 are remote from the substrate 31. It is this remote position of the free-end 34 & 36 conductive leads which eliminates the disassociation of leads from the epoxy or ceramic encapsulation material 31 caused by the different expansion rates of the epoxy or ceramic encapsulation material 31 and leads 33 & 35 common to LEDs and photo transistors with substrate supported metallic leads. The extended free ends 34 & 36 may expand at a rate different than the epoxy or ceramic encapsulation material 31 without separating from the substrate 31.

In this embodiment the optical element 37 formed as part of, or attached to, the epoxy or ceramic encapsulation material 31 is at a narrower fan angle then the preferred embodiment. It is envisioned that a plethora of optical elements with fan angles, relative to the board, from 5 to 90 degrees, varying other light shaping qualities, and a variety of substrate bound filtering materials may be incorporated into this device without departing from intended scope of the present invention.

Figure 4A:
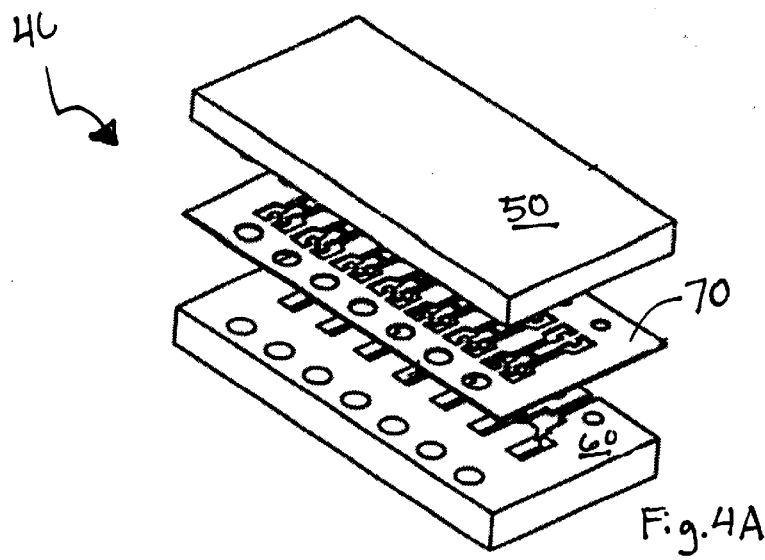
FIG. 4A is an assembly view of the injection transfer molding tool for manufacturing the present invention.

Referring now to FIG. 4A, there is illustrated an assembly view of the injection molding tool for manufacturing the present invention generally designated 40.

The molding tool 40 is used to construct either the side emitting surface mounted light-emitting diode 10 or the side sensing surface mounted photo transistor 20. The molding tool comprises a top half 50 a bottom half 60 and a metal frame insert 70. Molding tools are well-known in the art and therefore detailed explanations of the construction, usage and assembly are not included.

Figure 4B:
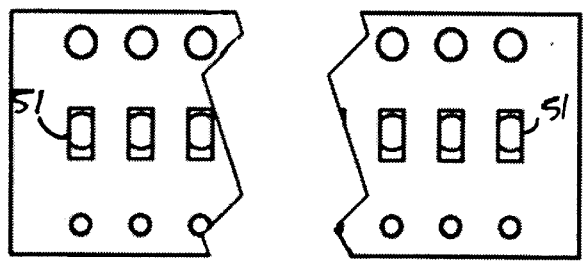
FIG. 4B is a top view of top half of the injection transfer molding tool of FIG. 4A.
Figure 4C:
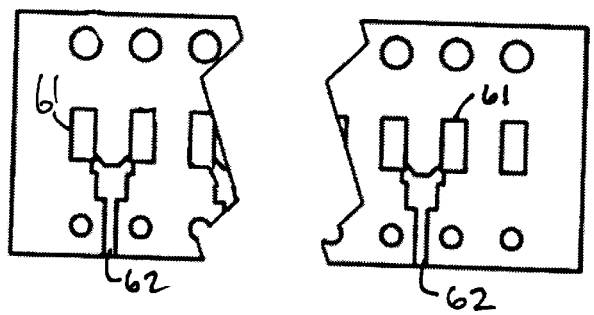
FIG. 4C is a top view of the bottom half of the injection transfer molding tool of FIG. 4A.
Figure 4D:
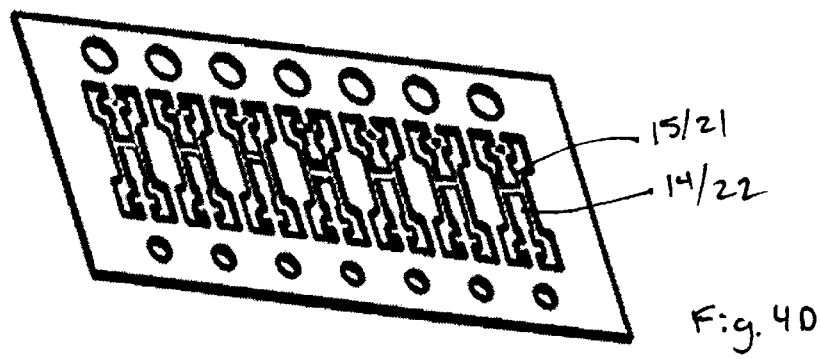
FIG. 4D is a top view of the metallic alloy insert for the injection molding tool of FIG. 4A.

Referring now to FIGS. 4B, 4C and 4D, there is illustrated a top view of the top half 50, bottom half 60, and metal frame insert 70 which acts as a substrate for the anodes 14 and cathodes 15 or emitters and collectors 21 & 22 which are stamped or etched in the metal frame insert 70.

To yield the desired optical element within the top half 50, cavities 51 of a size and shape to produce that desired optical element are formed. On the bottom half 60 a series of base forming cavities 61 into which encapsulation material, or substrate will be injected, thereby encapsulating the metal frame insert 70 within the base forming cavities 61. A series of side-gates 62 allow the introduction of the encapsulation material into the tool and direct it to either the back side or the left or right side of the cavities 51 & 61 eliminating any gate marks on the top or bottom side—thus yielding the zero draft, flat top and flat bottom for self-alignment as describe herein.

Referring now to FIGS. 5A, 5B, and 5C there is illustrated a cut-away top view, a front view and a cut away front view of a second alternate embodiment of the side emitting surface mounted light-emitting diode generally designated 80.

Within the epoxy or ceramic encapsulation material 81 a semi-conductor 82 is conductively affixed to a metallic anode lead 83 with an extended first free end 84. The metallic cathode lead 85 is opposite the anode lead 83 with an extended second free end 86. The two extended free ends 84 & 86 are remote from the substrate 81. It is this remote position of the free-end conductive leads which eliminates the disassociation of leads from the epoxy or ceramic encapsulation material 81 caused by the different expansion rates of the epoxy or ceramic encapsulation material 81 and leads 83 & 85 common to LEDs and photo transistors with substrate supported metallic leads. The two extended free ends 84 & 86 may expand at a rate different than the epoxy or ceramic encapsulation material 81 without separating from the substrate 81.

In this embodiment the optical element 87 is formed as part of, or attached to, the epoxy or ceramic encapsulation material 81 and is both circular and at a narrower fan angle then the preferred embodiment. To further capture the photonic output of the semi-conductor 82 and direct it through the optical element 87, a reflective well 88 is etched into the metallic anode lead 83 and the semi-conductor 82 conductively affixed thereto. The reflective well 88 captures and redirects the output 89 from the sides of the semi-conductor 82 towards the optical element 87 thereby increasing the quantity of photons directed through the optical element 87.

Since certain changes may be made in the above apparatus without departing from the scope of the invention herein involved, it is intended that all matter contained in the above description, as shown in the accompanying drawings, shall be interpreted in an illustrative, and not a limiting sense.

Since certain changes may be made in the above apparatus without departing from the scope of the invention herein involved, it is intended that all matter contained in the above description, as shown in the accompanying drawings shall be interpreted in an illustrative, and not a limiting sense.

What is claimed is:

1. A surface mounted light emitting diode comprising:
   a metallic alloy base anode conductivity bonded to a semi-conductor and a metallic alloy base cathode, forming a light emitting means;
   an encapsulation substrate molded around said metallic alloy anode and cathode with generally parallel flat top and bottom surfaces and an optical element;
   a pair of conductive leads attached to, or formed as part of, the light emitting means, each conductive lead extending from a side of the encapsulation substrate with a free-end remote from the encapsulation substrate; and,
   extended ends formed at each free-end of a diameter substantially equal to the distance between the flat top and bottom surfaces.

2. The surface mounted light emitting diode of claim 1, wherein the optical element is formed on the top surface.

3. The surface mounted light emitting diode of claim 1, wherein the optical element is roughly parallel to the top and bottom surfaces.

4. The surface mounted light emitting diode of claim 1, wherein the conductive leads form mirror image shapes whereby the surface mounted light emitting diode can mount parallel to the circuit board top side up or top side down.

5. The surface mounted light emitting diode of claim 4, wherein the flat top and bottom surfaces have no gate marks or flashings.

6. The surface mounted light emitting diode of claim 1, wherein the optical element is formed in a shape to distribute the light emitted by the light emitting means at a fan angle between 5 and 90 degrees.

7. The surface mounted light emitting diode of claim 1, wherein the optical element is formed in a shape to distribute the light emitted by the light emitting means substantially oval in the narrowest axis between 5 and 90 degrees.

8. The surface mounted light emitting diode of claim 1, wherein the optical element is formed in a shape to distribute the light emitted by said light emitting means substantially circular at a fan angle between 12 and 90 degrees.

9. The surface mounted light emitting diode of claim 1, wherein the light emitting means and the encapsulation substrate in combination emit a light between 360–2200 nms.

10. The surface mounted light emitting diode of claim 1, wherein said metallic base anode further comprises:
    an etched reflective seat formed therein; and,
    the semi-conductor is conductively bonded to the metallic alloy base anode within the etched reflective seat.

11. The surface mounted light emitting diode of claim 1, wherein the metallic alloy anode and cathode are formed of ALLOY-42 and the encapsulation substrate is formed of HYSOL MG-97-8000.

12. The surface mounted light emitting diode of claim 1, wherein the material of the semi-conductor is constructed from is selected from one or more of the group of semi-conductor materials including GA—Al—As—, Ga—Al—S, Al—Ga—S, Si—C, Ga—P, Ga—As—P, or InGas.

13. A surface mounted photo-transistor comprising:
    an emitter/collector means formed as part of, or affixed to, a metallic alloy;
    an encapsulation substrate molded around the emitter/collector means, with generally parallel flat top and bottom surface and an optical element;
    a first and a second conductive lead attached to, or formed as part of, the emitter/collector means, each conductive lead extending from a side of the encapsulation substrate with a free-end remote from the encapsulation substrate; and,
    extended ends formed at each free-end of a diameter substantially equal to the distance between the flat top and bottom surfaces.

14. The surface mounted photo-transistor of claim 13, wherein said optical element is roughly parallel to the flat top and bottom surfaces.

15. The surface mounted photo-transistor of claim 13, wherein the extended ends extend perpendicular from the free-ends.

16. The surface mounted photo-transistor of claim 13, wherein the flat top and bottom surfaces are without gate marks or flashings.

17. The surface mounted photo-transistor of claim 13, wherein the optical element is formed in a shape to distribute light to the emitter/collector means at a fan angle between 5 and 90 degrees.

18. The surface mounted photo-transistor of claim 13, wherein said optical element is formed in a shape to distribute light to the emitter/collector means at a fan angle between 5 and 90 degrees substantially oval in the narrowest axis.

19. The surface mounted photo-transistor of claim 13, wherein said optical element is formed in a shape to distribute light to the emitter/collector means at a fan angle between 12 and 40 degrees substantially circular.

20. The surface mounted photo-transistor of claim 13, wherein the emitter/collector means senses a light between 360–2200 nms.

21. The surface mounted photo-transistor of claim 13, wherein the metallic alloy of the emitter/collector means is formed of ALLOY-42 and the encapsulation substrate is formed of HYSOL MG-97-8000.

22. A surface mounted photo-circuit comprising:
   a surface mounted light emitting diode comprising:
      a metallic alloy base anode conductively bonded to a semi-conductor and a metallic alloy base cathode, forming a light emitting means;
      an encapsulation substrate molded around the light emitting means with generally parallel flat top and bottom surfaces and an optical element;
      a pair of conductive leads attached to, or formed as part of, the light emitting means each lead extending from a side of the encapsulation substrate, whereby said pair of conductive leads form free-ends which are remote from said encapsulation substrate; and,
      extended ends formed at each free-end of a diameter substantially equal to the distance between the flat top and bottom surfaces;
   a surface mounted photo-transistor comprising:
      an emitter/collector means formed as part of, or affixed to, a metallic alloy;
      an encapsulation substrate molded around the emitter/collector means with generally parallel flat top and bottom surface and an optical element;
      a first and a second conductive lead attached to, or formed as part of, the emitter/collector means each lead extending from a side of the encapsulation substrate with a free-end remote from the encapsulation substrate; and,
      extended ends formed at each free-end of a diameter substantially equal to the distance between the flat top and bottom surfaces.

23. The surface mounted photo-circuit of claim 22, wherein each optical element is formed on the top surface.

24. The surface mounted photo-circuit of claim 22, wherein each optical element is roughly parallel to the flat top and bottom.

25. The surface mounted photo-circuit of claim 22, wherein the flat top and bottom surfaces are flat with no gate marks or flashings.

26. A side mount light emitting diode;
   a side oriented light emitting means within an encapsulation substrate with two extended lead wires forming a light emitting diode;
   a substantially flat top surface of the light emitting diode;
   a substantially flat bottom surface of the light emitting diode;
   two side surfaces of the light emitting diode with a lead wire extending from each side surface of the light emitting diode; and,
   an extended free end formed on each portion of lead wire extending from the side surface of the light emitting diode, wherein the extended free end has a diameter substantially equal to the distance between the top and bottom surfaces.

* * * * *

UNITED STATES PATENT AND TRADEMARK OFFICE
CERTIFICATE OF CORRECTION

PATENT NO. : 6,677,707 B1 Page 1 of 1
DATED : January 13, 2004
INVENTOR(S) : Dietiker, Thomas It is certified that error appears in the above-identified patent and that said Letters Patent is hereby corrected as shown below:

<u>Title page,</u>
Item [73], Assignee, delete the assignee.

Signed and Sealed this

Twenty-eighth Day of March, 2006

JON W. DUDAS
*Director of the United States Patent and Trademark Office*